United States Patent
Rao et al.

(10) Patent No.: US 6,924,004 B2
(45) Date of Patent: Aug. 2, 2005

(54) APPARATUS AND METHOD FOR SYNTHESIZING FILMS AND COATINGS BY FOCUSED PARTICLE BEAM DEPOSITION

(75) Inventors: Nagaraja P. Rao, San Leandro, CA (US); Joachim Heberlein, North Oaks, MN (US); William Gerberich, Shorewood, MN (US); Steven L. Girshick, Minneapolis, MN (US); Peter H. McMurry, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/333,273

(22) PCT Filed: Jul. 19, 2001

(86) PCT No.: PCT/US01/22766

§ 371 (c)(1),
(2), (4) Date: Sep. 10, 2003

(87) PCT Pub. No.: WO02/05969

PCT Pub. Date: Jan. 24, 2002

(65) Prior Publication Data

US 2004/0046130 A1 Mar. 11, 2004

Related U.S. Application Data

(60) Provisional application No. 60/219,728, filed on Jul. 19, 2000.

(51) Int. Cl.⁷ ............................................. C23C 16/448
(52) U.S. Cl. ................... 427/421.1; 137/12; 137/484.2; 118/300; 239/79; 359/262; 401/190; 427/197; 427/180; 427/427.1; 427/446; 427/561; 427/562
(58) Field of Search ................................. 427/197, 180, 427/421.1, 427.1, 446, 561, 562; 137/13, 484.2; 239/79; 118/300; 359/262; 401/190

(56) References Cited

U.S. PATENT DOCUMENTS

| | | | |
|---|---|---|---|
| 5,270,542 A | | 12/1993 | McMurry et al. |
| 5,453,306 A | * | 9/1995 | Tatsumi et al. ............. 427/569 |
| 5,460,701 A | * | 10/1995 | Parker et al. ............... 204/164 |
| 5,514,350 A | * | 5/1996 | Kear et al. .................. 422/198 |
| 5,565,677 A | * | 10/1996 | Wexler et al. .............. 250/251 |
| 5,874,134 A | | 2/1999 | Rao et al. |
| 6,280,802 B1 | * | 8/2001 | Akedo et al. ............... 427/561 |
| 6,379,419 B1 | * | 4/2002 | Celik et al. .................. 75/346 |
| 6,387,531 B1 | * | 5/2002 | Bi et al. ...................... 428/402 |
| 6,610,959 B2 | * | 8/2003 | Carlson et al. .......... 219/76.15 |

OTHER PUBLICATIONS

Rao et al., "Nanoparticle Formation Using A Plasma Expansion Process," *Plasma Chemistry and Plasma Processing*, New York, Dec. 1, 1995, vol. 15, No. 4, pp. 581–606.

Akedo et al., "Jet Molding System for Realization of Three–Dimensional Micro–Structures," *Sensors and Actuators A*, 1998, vol. 69, pp. 106–112.

N. Tymiak et al., "Hypersonic Plasma Particle Deposition of Nanostructured Silicon Carbide Films," *Proceeding of the 14th International Symposium on Plasma Chemistry, Prague*, Aug. 2–6, 1999, Vo.. 7, pp. 1989–1994.

(Continued)

*Primary Examiner*—Archene Turner
(74) *Attorney, Agent, or Firm*—Fish & Richardson P.C.

(57) ABSTRACT

A particle beam deposition apparatus includes a particle source for generating a plurality of particles in suspended form, an expansion chamber, and a deposition chamber connected to the expansion chamber by an aerodynamic focusing stage, and containing a substrate. The aerodynamic focusing stage may be comprised of a plurality of aerodynamic focusing elements, or lenses. Particles, including nanoparticles, may be deposited on the substrate by generating an aerosol cloud of particles, accelerating the particles into the expansion chamber, creating a collimated beam out of the particles by passing them through the aerodynamic focusing lenses and into a deposition chamber, and impacting the particles into the substrate.

18 Claims, 6 Drawing Sheets

OTHER PUBLICATIONS

D. Iordanoglou, et al., "Deposition of Nanostructured Films by Hypersonic Impaction of Nanoparticles," *Abstracts 18th Annual AAAR Conference, Tacoma , WA*, Oct. 11–15, 1999, p. 203.

D. Iordanoglou, et al., "Hypersonic Plasma Particle Deposition of Large–Area and Patterned Nanostructured Films," *Abstracts, Materials Research Society Fall 1999 Meeting*, Boston, Nov.29–Dec. 3, 1999, p. 194.

Girshick, et al., "Hypersonic Plasma Particle Deposition of Nanostructured Films and Patterns," *Proceedings of 2000 NSF Design and Manufacturing Research conference, Vancouver, British Columbia, Canada*, Jan. 3–6, 2000, 8 pages.

F. Di Fonzo, et al., "Focused Nanoparticle–beam Deposition of Patterned Microstructures," Applied Physics Letter, Aug. 7, 2000, vol. 7, No. 6, pp. 910–912.

* cited by examiner

APPARATUS AND METHOD FOR SYNTHESIZING FILMS AND COATINGS BY FOCUSED PARTICLE BEAM DEPOSITION

CROSS-REFERENCE TO RELATED APPLICATIONS

This application is a National Stage application under 35 U.S.C. §371 and claims benefit under 35 U.S.C. §119(a) of International Application No. PCT/US01/22766 having an International Filing Date of Jul. 19, 2001, which claims benefit of U.S. Provisional application Ser. No. 60/219,728 filed on Jul. 19, 2000.

STATEMENT AS TO FEDERALLY-SPONSORED RESEARCH

Funding for work described herein was provided in part by the federal government, which may have certain rights in the invention.

TECHNICAL FIELD

This invention relates to deposition of particles on a substrate, and more particularly to deposition of nanoparticles by focused particle beam deposition to form films or coatings.

BACKGROUND

The synthesis and processing of nanostructured materials, i.e., materials with grain sizes less than about 100 nm, is of great interest because such materials are known to have properties different from, and often superior to, those of conventional bulk materials. These advantages include greater strength, hardness, ductility, and sinterability, size-dependent light absorption, and greater reactivity. Applications for these advanced materials include ductile ceramics, wear-resistant coatings, thermal barrier coatings, new electronic and optical devices, and catalysts. There has been considerable progress in determining the properties of nanostructured materials, small amounts of which have been synthesized (mainly as nanosize powders), by processes such as colloidal precipitation, mechanical grinding, and gas-phase nucleation and growth. The focus of more recent research has been to produce nanostructured materials directly in a form suitable for use in a practical application, such as wear-resistant coatings. In such materials, the nanostructure is deliberately introduced to take advantage of superior properties, for example, enhanced hardness in the case of nanostructured wear-resistant coatings.

The current interest in nanostructured materials has led to the search for methods to synthesize such materials in the form of bulk solids or films. The production of nanostructured materials has generally involved two or more steps, including the controlled synthesis of nanosize powders, and the assembly of these powders into nanostructured materials by sintering or other means.

Gas-phase nucleation and growth of particles is an established route for the synthesis of nanosized powders and includes such techniques as evaporation-condensation, laser pyrolysis, and thermal plasma expansion processing. Gleiter, H., "Nanocrystalline Materials," Prog. Mater. Sci. 33:223–315 (1989); Recknagle, K. et al., "Design and Operation of a Nanocluster Generation and Collection System," Aerosol Sci. Technol. 22:3–10 (1995); Oda, M. et al., "Ultrafine particle films by gas deposition method," Mat. Res. Soc. Symp. Proc. 286:121–130 (1993); Flint, J. H. et al., "Powder temperature, size and number density in laser-driven reactions," Aerosol Sci. Technol. 5:249–260 (1986); Rao, N. et al., "Nanoparticle formation using a plasma expansion process," Plasma Chem. Plasma Proc., 15:581–606 (1995). In many of these gas-phase processes, the nanosize powders are collected thermophoretically and consolidated in-situ using high pressure compaction to produce pellets of nanostructured materials. Gleiter, H., "Nanocrystalline Materials," Prog. Mater. Sci. 33:223–315 (1989); Recknagle, K. et al., "Design and Operation of a Nanocluster Generation and Collection System," Aerosol Sci. Technol. 22:3–10 (1995).

The use of inertial impaction provides a convenient route for assembling particles into consolidated materials, including nanoparticles into nanostructured materials. That is because heavy particles seeded in a light carrier gas can be deposited efficiently by accelerating the gas through a nozzle, preferably into a low pressure region, and directing the resulting high speed aerosol jet against a deposition substrate. Fernandez de la Mora, J., "Surface impact of seeded jets at relatively large background densities," J. Chem. Phys. 82:3453–3464 (1985); Fernandez de la Mora et al., "Hypersonic impaction of ultrafine particles," J. Aerosol Sci. 21:169–187 (1990). At sufficiently low pressures, even though the host gas may decelerate before impacting the substrate, e.g., by formation of a shock, the heavy particles continue their forward motion and impact by virtue of their greater inertia.

Until recently, high-speed impaction had been used mainly for particle measurement. More recently, however, a number of materials deposition processes based on this principle have been developed, including those that deposit heavy molecules, ultra fine particles, and large micron-sized particles. Schmitt, J. J., "Method and apparatus for the deposition of solid films of a material from a jet stream entraining the gaseous phase of said material," U.S. Pat. No. 4,788,082 (1988); Halpern, B. L. et al., "Gas jet deposition of thin films," Appl. Surf. Sci. 48/49:19–26 (1991); Calcote, H. F. et al., "A new gas-phase combustion synthesis process for pure metals, alloys, and ceramics," 24th Symp. (Intl.) on Combustion, Combustion Inst. Pittsburgh 1869–76 (1992); Kashu, S. et al., "Deposition of ultrafine particles using a gas jet," Jap. J. Appl. Phys. 23:L910–912 (1984); Oda, M. et al., "Ultrafine particle films by gas deposition method," Mat. Res. Soc. Symp. Proc. 286:121–130 (1993); Gould, R. K. et al., "Apparatus for producing high purity silicon from flames of sodium and silicon tetrachloride," U.S. Pat. No. 5,021, 221 (1991).

Some of the inventors of this disclosure have themselves participated in developing a process, hypersonic plasma particle deposition (HPPD), for the inertial deposition of nanoparticles to form nanostructured films. In HPPD, vapor-phase reactants are injected into a thermal plasma, which is then expanded to low pressure through a nozzle. Rapid cooling in the nozzle expansion drives the nucleation of nanoparticles, which are then accelerated in the hypersonic free jet issuing from the nozzle. A substrate may be positioned normal to the flow, and particles as small as a few nanometers in diameter deposit by inertial impaction. Ballistic compaction forms a dense, nanostructured coating. In experiments involving silicon carbide deposition, the grain size observed by scanning electron microscopy (SEM), typically around 20 nm, corresponded closely to measurements by scanning electrical mobility spectrometry of the aerosol sampled in-flight downstream of the nozzle, indicating that the film retained the grain size of the impacting particles. Rao, N. P. et al., "Nanostructured materials production by hypersonic plasma particle deposition," Nanostructured Materials, 9:129–132 (1997); Rao, N. P. et al., "Hypersonic Plasma Particle Deposition of Nanostructured Silicon and Silicon Carbide," J. Aerosol Sci., 29:707–720 (1998); Rao, N. et al., "Plasma chem. Plasma Process 15, 581 (1995); Neumann, A. et al., "J. Nanoparticle Res., accepted for publication January 1999; Blum, J. et al., "Nanoparticle Research," 1, 31 (1999). A patent on the HPPD process, U.S. Pat. No. 5,874,134, assigned to the Regents of the University of Minnesota, is hereby incorporated by reference.

Nanoparticle deposition processes have recently been used to create patterned films without the use of masking through the use of collimated beams of nanoparticles. Most of this work has been directed at depositing metal patterns for printed circuit board and electronics applications. Schroth, A. et al., Jpn. J. Appl. Phys., 37, 5342 (1998); Akedo, J. et al., Jpn. J. Appl. Phys., 38:5397 (1999); Akedo, M. et al., "Sensors Actuators," A 69:106 (1998). For example, the gas jet deposition (GJD) process has been used to "write" metal patterns for depositing gold or silver particles generated by inert gas-condensation. Hayashi, C. et al., "The use of nanoparticles as coatings," Materials Sci. Eng. A163:157–161 (1993). In this method, condensable vapor is generated above a heated crucible and particles nucleate in an inert carrier gas. The particle-laden flow then expands supersonically through a micronozzle, producing a particle beam whose dimensions are approximately the same as, or perhaps somewhat smaller than, those of the nozzle. Nozzles with inside diameters of 100 $\mu$m were used to deposit gold particles, producing tapered needle-shaped structures. Several deposition nozzle designs were tested, including rectangular slit-type geometric and multinozzle assemblies.

Similar techniques have been used to create patterned films by depositing iron nanoparticles, and more recently to fabricate high aspect ratio structures for micro-electro-mechanical systems (MEMS) applications. A variety of techniques were used, including free forming, insert-molding, and substrate masking. To suppress clogging, the nozzles were heated, so as to drive particles away from the nozzle walls by thermophoretic forces. Representative techniques are described in Kizaki, Y. et al., "Ultrafine Particle Beam Deposition I. Sampling and Transportation Methods for Ultrafine Particles," Jpn. J. Appl. Phys. Vol. 32:5163–5169 (1993); Akedo, J. et al., "Fabrication of Three Dimensional Micro Structure Composed of Different Materials Using Excimer Laser Ablation and Jet Molding," Proceedings of the 10th Annual International Workshop on Micro Electro Mechanical systems, Nagoya, Japan, 135–140, Jan. 26–30, 1997.

Although the GJD process has aspects similar to HPPD, the process conditions used in GJD are significantly different, with a relatively high particle source chamber pressures (~0 Torr ~5 atm.), necessitating the use of light carrier gases (e.g., helium) and small nozzle dimensions (~100 $\mu$m) to achieve inertial deposition of nanoparticles. Deposition rates for GJD are on the order of 10 $\mu$m/min, with deposit dimensions close to that of the nozzle, though the sharpness of the pattern is somewhat limited by the presence of a broad "tail" surrounding the core deposit.

The GJD method is limited in its ability to produce very small features. Pattern feature dimensions have been decreased down to 40 $\mu$m by suitably reducing nozzle dimensions. Reducing the nozzle size, however, greatly diminishes the deposition rate, since the gas flow rate varies as the square of the nozzle diameter. In addition, the use of small nozzles makes it more difficult to control the nozzle-to-substrate distance precisely, which in the GJD process scales with the nozzle diameter and determines the cut-size of impacting particles. Smaller nozzles are also difficult to manufacture with precision and are more susceptible to clogging at high particle loading.

Particle beams in areas other than nanoparticles have been controlled and focused using aerodynamic lenses. Aerodynamic focusing is discussed by Dahneke, B. et al., "Similarity theory for aerosol beams," J. Colloid Interface Sci., 87, 167–179 (1982); Fernandez de la Mora et al., "Aerodynamic focusing of particles and molecules in seeded supersonic jets," in Rarefied Gas dynamics: Physical Phenomena, [edited by Muntz, E. P., weaver, D. P. and Campbell, D. H.], Vol. 117 of Progress in Astronautics and Aeronautics, AIAA, Washington D.C., 247–277 (1989), and aerodynamic lenses are described by Liu, P. et al., "Generating particle beams of controlled dimensions and divergence: I. Theory of particle motion in aerodynamic lenses and nozzle expansions," Aerosol Sci. Technol. 22:293–313 (1995); Liu, P. et al., "Generating particle beams of controlled dimensions and divergence: II. Experimental evaluation of particle motion in aerodynamic lenses and nozzle expansions," Aerosol Sci. Technol. 22:314–324 (1995). In aerodynamic focusing, particles may be shaped into a narrow beam by passing the aerosol through a series of constrictions (aerodynamic lenses). The gas undergoes a converging and diverging motion as it flows through the lenses. Due to inertia, particles seeded in the flow may either concentrate along the flow axis or be deposited on the walls of the focusing system, depending on their size. For a given lens geometry, gas composition, particle composition, and gas flow rate, this tendency to focus depends strongly on the particle size. Particles of a certain critical size are pushed to the axis, while subcritical particles show a concentrating tendency that decreases with particle size. Particles larger than critical overshoot the focal point and are removed from the flow by collision with walls. With a single lens, only particles within a very narrow range of particle sizes are focused. Particles within a broader size range can to be focused by using a set of focusing lenses with gradually decreasing diameters. Typically, five lenses may be needed to cover one order of magnitude in particle size. The lenses may be used in combination with a downstream supersonic nozzle to accelerate and deposit particles in a specified range of particle sizes. Aerodynamic focusing is discussed in U.S. Pat. No. 5,270,542, incorporated herein by reference.

SUMMARY

A new technology is described herein for depositing patterned films and coatings in general, and functional nanostructures such as nanostructured patterned films and coatings in particular. The technology is based on the generation of gas-borne particles, such as nanoparticles from a thermal plasma expansion reactor, confining the particles in a narrow, high-speed particle beam by passing the aerosol flow through an aerodynamic focusing stage, followed by high-speed impaction of the tightly focused particles onto a substrate in a vacuum deposition chamber. The focusing stage may consist of one or more focusing elements (aerodynamic lenses) and a nozzle that may be integrated into the inlet of the deposition chamber. The aerodynamic lenses may focus the particles emerging from the aerosol source into a narrow beam, while the nozzle accelerates the focused particles to terminal velocities on the order of the sonic speed of the carrier gas. The particles in the beam may be deposited by inertial impaction onto the substrate in the evacuated deposition chamber, resulting in the formation of a consolidated deposit. Patterned films may be deposited by translating the substrate with respect to the nozzle, or vice versa.

Nanostructured patterned films of various materials may be deposited in this manner using an aerosol source wherein the generated particles are nanosized (i.e., with diameters<100 nm). Nanostructured patterns of materials such as silicon carbide may be used in applications such as wear-resistant coatings for MEMS or micro-fluidics systems and devices. Line widths of less than 50 microns can be produced. This approach can permit the use of much larger nozzles than in previously developed micronozzle methods, and also can permit size-selection of the particles that are deposited.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
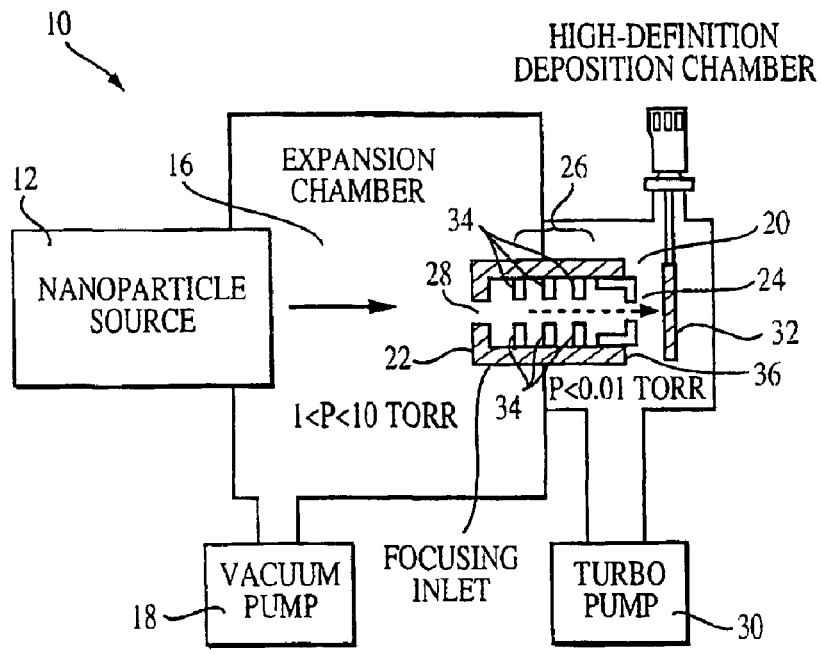
FIG. 1 is a schematic diagram of a system for depositing nanoparticles on a substrate via a collimated beam.

A novel technology, termed focused particle beam deposition (FPBD), is capable of depositing patterned films, including nanostructured patterned films, with higher deposition rates and sharper definition than that possible with the prior art processes. One type of apparatus for practicing FPBD is schematically depicted in FIG. 1. In the apparatus 10, gas-borne particles are generated in a source 12 such as a plasma expansion reactor. The particles are transported by the flow into an intermediate expansion chamber 16, which is maintained at a pressure, typically below 10 torr, by a mechanical vacuum pump 18. The expansion chamber 16 may communicate with a downstream deposition chamber 20 through a focusing inlet 24. A portion of the expanded flow from the aerosol source may enter the deposition chamber 20 through an inlet 24 provided with aerodynamic focusing lenses 26 and an accelerating nozzle 28. The deposition chamber 20 may be evacuated by a vacuum pump 30, such as a turbo pump, and maintained at a low pressure, e.g., on the order of 0.01 torr or lower in the case of a turbo pump.

The particles in the flow entering this final chamber 20 may be focused into a narrow beam and then impacted at high speeds against a substrate 32 placed within the chamber 20, at a distance within 1–100 nozzle diameters downstream of the inlet 24. Patterned films may be deposited by translating the substrate 32 in relation to the nozzle, or vice-versa. The differential pumping arrangement of the type shown in FIG. 1 is flexible and may permit independent control of aerosol source flow and deposition flow rates. Flexibility in setting the pressure of the intermediate chamber may provide a means by which to apply the FPBD process over a broad range of particle sizes. In addition, the aerosol expansion chamber could be omitted under certain conditions.

The focusing assembly 22 may consist of a series of thin plates 34 mounted in a cylindrical barrel 36. Each plate 34 has an orifice, or "aerodynamic lens," located at its center, and the assembly 22 may terminate in an exit nozzle 24, which is a sonic orifice. In passing through each lens 26, the streamlines of the gas flow contract and re-expand. Very small particles follow the gas streamlines. Very large particles accelerate radially toward the axis as the flow approaches the orifice. Due to their high inertia, these particles are projected across the centerline and impact on the opposite wall of the focusing assembly. Particles of an intermediate size are also accelerated toward the axis, but due to their shorter aerodynamic stopping distance, they terminate their radial motion on a flow streamline that is closer to the axis than the one on which they originated. This may lead to a concentration of such particles along the axis. By careful design of lens assembly 22, it is possible to collimate particles having a specified range of sizes.

The use of aerodynamic lenses upstream of the nozzle may enable the deposition of entrained particles within a tightly confined area whose diameter is substantially narrower than that of the nozzle, e.g., by an order of magnitude or more. As a result, for equivalent nozzle sizes, the use of aerodynamic focusing may enable the deposition of pattern features with dimensions up to 10 sizes smaller than that possible with conventional gas jet deposition without the use of lenses. Alternatively, for equivalent feature dimensions and source particle concentrations, the use of aerodynamic focusing can permit deposition rates (i.e., "pattern writing speeds") 100 times greater than that possible in conventional gas jet deposition without focusing. The minimum attainable beam diameter depends on practical design issues such as tolerances in lens alignment and the residual thermal motion of particles exiting the nozzle. Small particles still retain a component of thermal velocity in the radial direction which causes the focused beam to broaden downstream of the nozzle. The beam diameter increases with decreasing particle size and increasing beam path length. For a beam of 20 nm particles, the beam divergence over a nozzle-to-substrate separation distance of 5 mm may be on the order of 10 $\mu$m. This is relatively low, and it is likely that factors such as tolerances in lens alignment will have a greater effect on the minimum attainable feature size.

Figure 2:
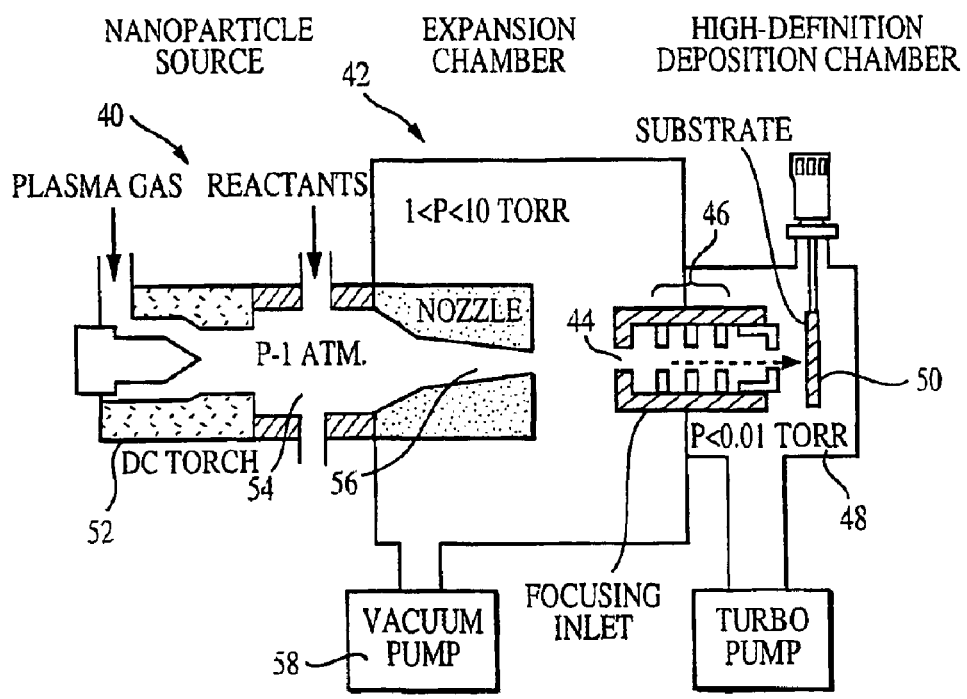
FIG. 2 is a schematic diagram of another system for depositing nanoparticles on a substrate via a collimated beam.

In one embodiment of the system, shown in FIG. 2, particles in the sub-100 nm range may be generated in a nanoparticle source 40 comprising a plasma expansion reactor. The in-flight agglomeration of the particles may be minimized by hypersonic transport into an intermediate expansion chamber 42. The particles may then be confined into a narrow beam by passage through a focusing inlet 44 provided with aerodynamic lenses 46, communicated with a downstream vacuum deposition chamber 48, and deposited onto a translating substrate 50. The nanoparticle source 40 preferably comprises a dc torch 52 with a ceramic flow passage 54 mounted downstream, into which reactant feedstock, preferably in gas- or vapor-phase, is injected. The pressure in the injection region is preferably in the range 300–750 torr, but may be any appropriate value. Nanoparticles are nucleated by expanding the hot reacting gases through a ceramic-lined nozzle 56, preferably having exit diameters in the range 1–10 mm. The gas temperature at the nozzle entrance is preferably between 2000K and 5000K, and that at the nozzle exit between 1000K and 2500K. The expansion chamber is preferably at a pressure below 10 torr. and is pumped by a large Roots Blower (or equivalent) mechanical vacuum pump 58. Flow rates through the reactor are preferably in the range 1–100 slpm.

The focusing inlet 44 communicating with the final deposition chamber 48 may have multiple lens elements 46 to focus a broad range of particle sizes. In certain embodiments, it may be preferable to have three to five lens elements. The inlet 44 may be provided with an accelerating nozzle which may be operated under choked flow to accelerate the particles previously focused. The diameters of the aerodynamic lens elements 46 are selected preferably to focus particles within the sub-100 nm diameter range. The diameters of the lens elements 46 and the nozzle preferably range from 0.1 to 5 mm. The actual values depend on process parameters such as carrier gas composition, expansion chamber temperature and pressure, and particle aerodynamic diameter. The nozzle-to-deposition substrate distance is preferably in the range of 1–100 nozzle diameters.

The system and process are not limited to sources comprising a thermal plasma reactor alone. The FPBD process is also not limited to particles generated by chemical reaction alone, but is also applicable to particles generated by physical evaporation and condensation, e.g., starting from feedstock materials including solids, liquids, and gases; and by electrospray processing. The FPBD concept can be applied in general to any source of gas-borne nanoparticles, including laser pyrolysis reactors, evaporation-condensation reactors, or electrospray atomizers, in processes in which the object of processing is the deposition of gas-borne nanoparticles onto substrates to form patterned films of various materials, such as metals, inorganic materials (e.g., ceramic oxides, carbides, nitrides, and mixtures of the same), and organic materials (e.g., polymers and plastics). The FPBD system incorporating a nanoparticle source can be used to deposit nanostructured patterned films, which may possess unique and enhanced properties when compared to films of more conventional materials.

Experiments were conducted in which either SiC or titanium nanoparticles were generated. An argon-hydrogen plasma was generated by a direct-current arc. Reactants were injected into the plasma at the upstream end of the expansion nozzle. The reactants consisted either of silicon tetrachloride and methane, for silicon carbide synthesis, or titanium tetrachloride, for titanium synthesis. The pressure was approximately 50 kPa at the nozzle inlet and 345 Pa in the expansion chamber. The plasma is hot (approximately 2000 K) at the nozzle exit and expands supersonically into the large expansion chamber. The inlet tube to the aerodynamic lens assembly was coaxially located 75 cm downstream of the plasma expansion nozzle. The flow in the expansion chamber experienced a series of expansion and compression waves, and is expected to have relaxed to close to room temperature at the inlet of the lens assembly.

The lens assembly consisted of a series of five lenses, each with an orifice diameter of 2.26 mm. The inner diameter of the exit nozzle was 1.85 mm. Each lens was 0.3 mm thick, and the lenses were spaced 47 mm apart. The entire unit was constructed of stainless steel.

The particle beam exiting the lens assembly issued into a chamber that was maintained at a pressure of 1.0 Pa. Substrates were mounted in this chamber, typically 3 mm downstream of the exit nozzle. The particle impact velocity was estimated to be in the range 200–300 m/s. The substrates were at room temperature. Various substrate materials were used, including stainless steel, aluminum, brass and glass. Adherent deposits formed on all of the metal substrates, but not on glass.

Figure 3A:
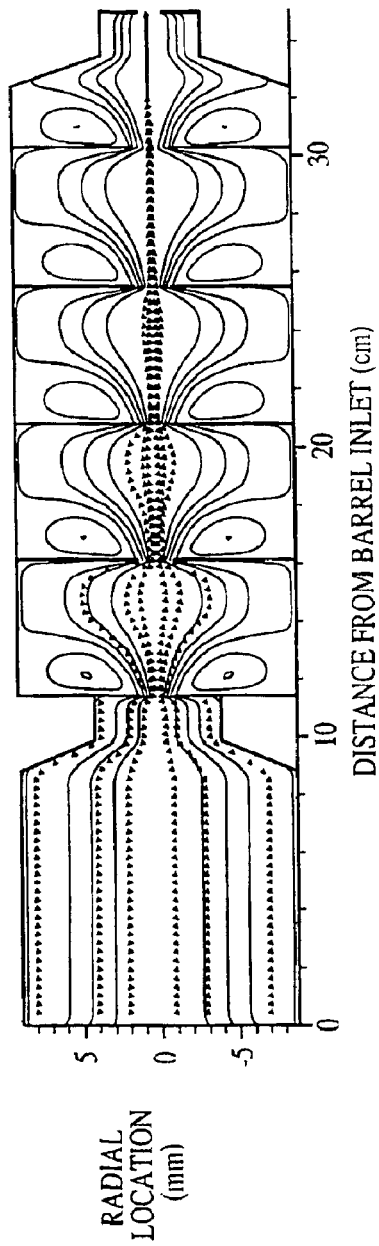
FIG. 3a is a diagram of predicted gas streamlines in a nanoparticle focused beam deposition system.
Figure 3B:
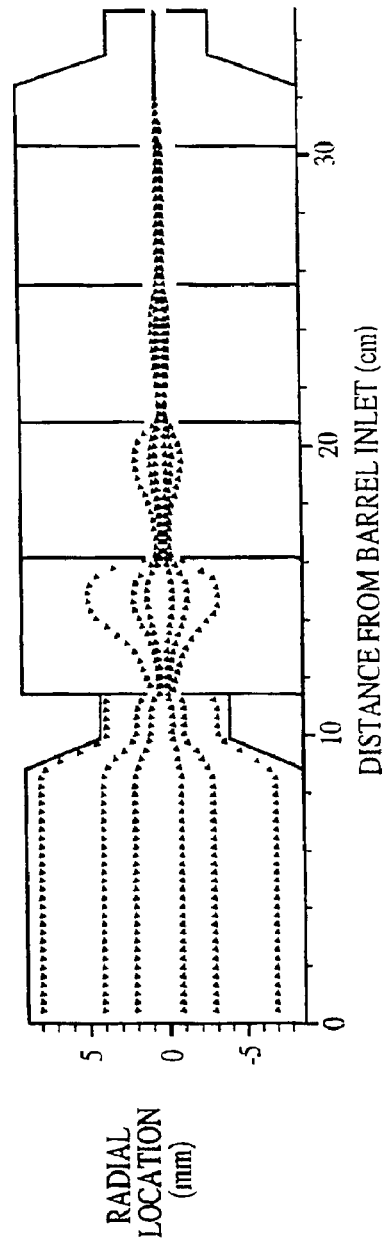
FIG. 3b is a diagram of predicted particle trajectories in a nanoparticle focused beam deposition system.

Numerical simulations were conducted to predict the flow of carrier gas and the trajectories of (assumed spherical) silicon carbide particles of various sizes through a lens system with the same geometry and conditions as in the experiments. These simulations solved the conservation equations for steady, laminar, compressible flow, and calculated particle trajectories accounting for viscous drag but not Brownian diffusion. Brownian diffusion would be expected to broaden the width of the focused beam, especially for particles smaller than about 10 nm in diameter. The predicted gas streamlines and trajectories of 20-nm-diameter particles that enter the lens assembly along various streamlines are shown in FIGS. 3a and 3b, respectively. The particles are predicted to be well collimated along the flow axis by the exit of the final lens.

Figure 4:
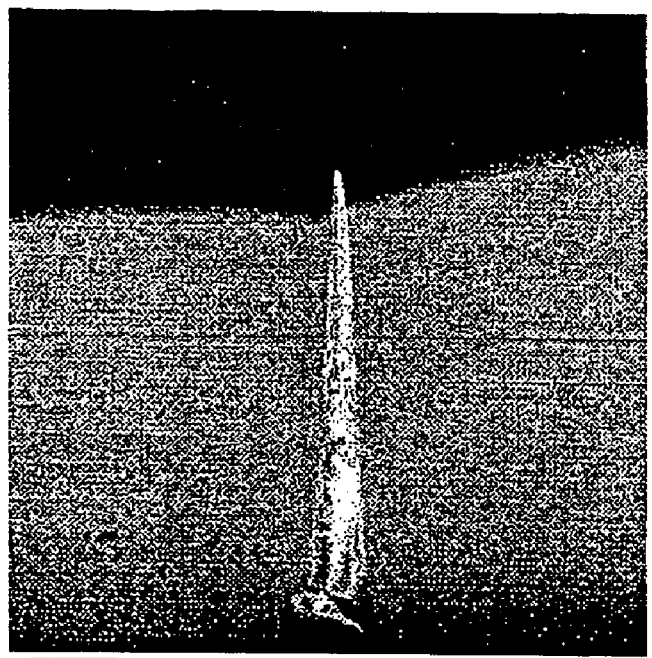
FIG. 4 is a scanning electron microscope image of a needle-shaped silicon carbide tower produced by nanoparticle focused beam deposition.

An SEM image of a needle-shaped silicon carbide tower deposited on a stationary substrate produced by FPBD is shown in FIG. 4. The height of this structure is 1.3 mm. The compact, tapered appearance is typical for both SiC and titanium. High-resolution SEM images obtained from cross-sections of the titanium deposits show grain sizes of about 20 nm, similar to those previously reported for HPPD of silicon carbide. In general, the height, half-width, and base diameters of the towers increase linearly with deposition time, and the dimensions are similar to those using micronozzles. Kashu, S. et al., Jpn. J. Appl. Phys. 23:L910 (1984); Oda, M. et al., MRS Symp. Proc. 286:121 (1993); Schroth, A. et al., Jpn. J. Appl. Phys. 37:5342 (1998); Akedo, J. et al., Jpn. J. Appl. Phys. 38:5397 (1999); Akedo, J. et al., Sensors Actuators A 69:106 (1998). However, aerodynamic focusing may allow one to use much larger nozzles to achieve the equivalent results. Because a ten-fold increase in nozzle diameter corresponds to a hundred-fold increase in flowrate, aerodynamic focusing may allow much higher throughputs. In addition, although nozzle clogging may still be an issue with the present system, the use of larger nozzles should help alleviate the problem.

Figure 5:
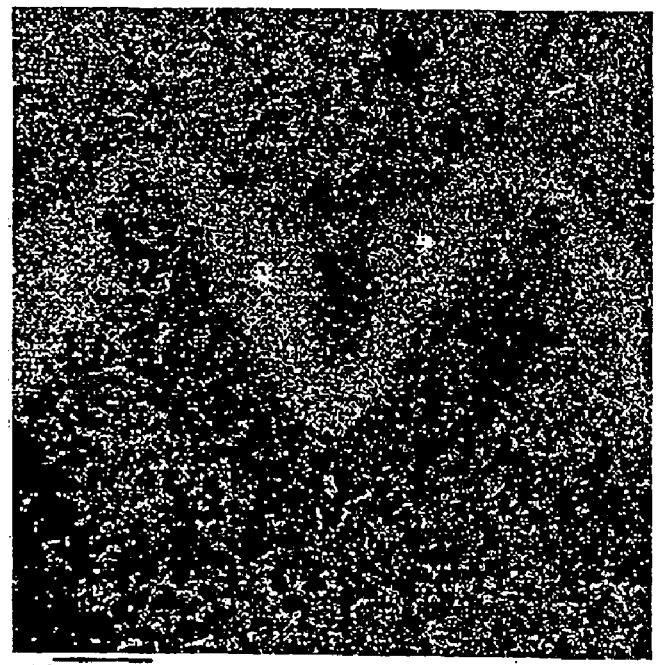
FIG. 5 is a scanning electron microscope image of a pattern of silicon carbide produced by nanoparticle focused beam deposition.

Experiments have demonstrated the feasibility of depositing lines and two-dimensional patterns by translating the substrate. A pattern formed by SiC particles is shown in FIG. 5. The substrate was translated manually in a rapid zig-zag motion. The minimum line width is about 50 $\mu$m. As can be seen in the figure, towers began to grow at several points when the translation momentarily paused. An automated x-y translation system has also been implemented and has been used to deposit titanium lines, with a width of about 30 to 50 $\mu$m. Lower Si precursor feeds in the plasma reactor improve operation characteristics and produce cleaner nanoparticle streams. FIGS. 4 and 5 are not very clear—image quality is very poor.

Downstream of the lenses, a critical nozzle forces hypersonic deposition of the particles. The dimensions of that nozzle define the final feature size of the patterns. Beams with diameters in the order of tens of microns may be produced.

Figure 6:
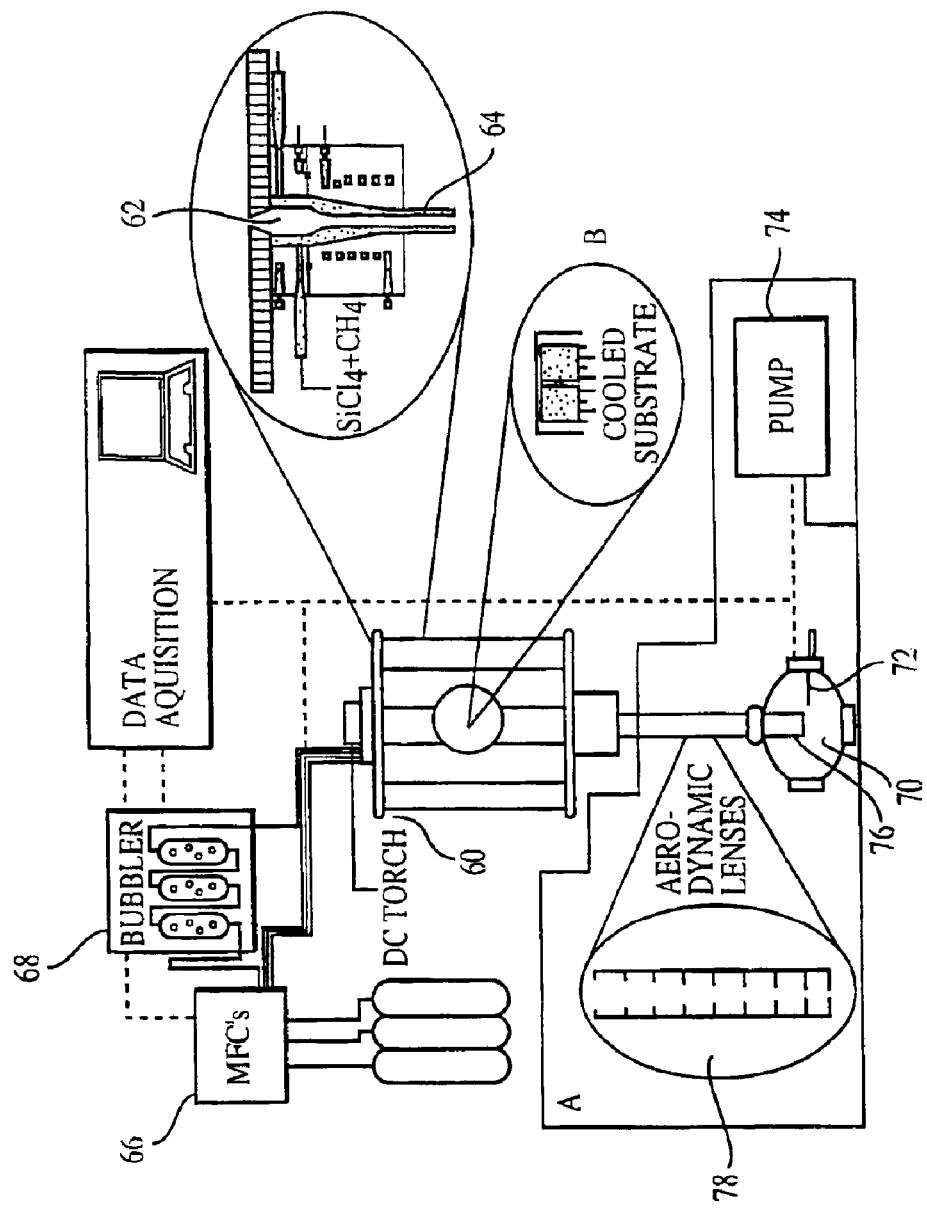
FIG. 6 is a schematic diagram of a system for depositing nanoparticles on a substrate via a collimated beam.

Another embodiment, which can be used at relatively low flow rates, is shown schematically in FIG. 6. Its principle component is a high-temperature plasma reactor 60 with an injection ring 62 and a nozzle 64. The injection ring 62 and nozzle 64 may be constructed from a single piece of boron nitride. Reactants (e.g., $SiCl_4$ and $CH_4$) may be injected into the plasma, at a location where the temperature is high enough (e.g., >4000K) to promote virtually complete disassociation. Inside the nozzle 64, rapid quenching causes particles to nucleate. These particles may then be accelerated with the flow to supersonic velocities. The reactant feed system 66 may include a bubbler system 68 to gasify the $SiCl_4$ liquid precursor.

Substrate temperature control may be achieved by a cooling system (not shown) which may combine water and Ar/He feed, according to the design of Bieberich and Girshick. Bierberich, M. T., and Girshick, S. L., Plasma Chem. Plasma Process. 16:157S (1996). A second chamber 70 containing the substrate 72 may be pumped down to $-10^3$ Torr by a turbomolecular pump 74, to assist in hypersonic expansion through the critical orifice 76 located after the aerodynamic lenses 78.

Figure 7A:
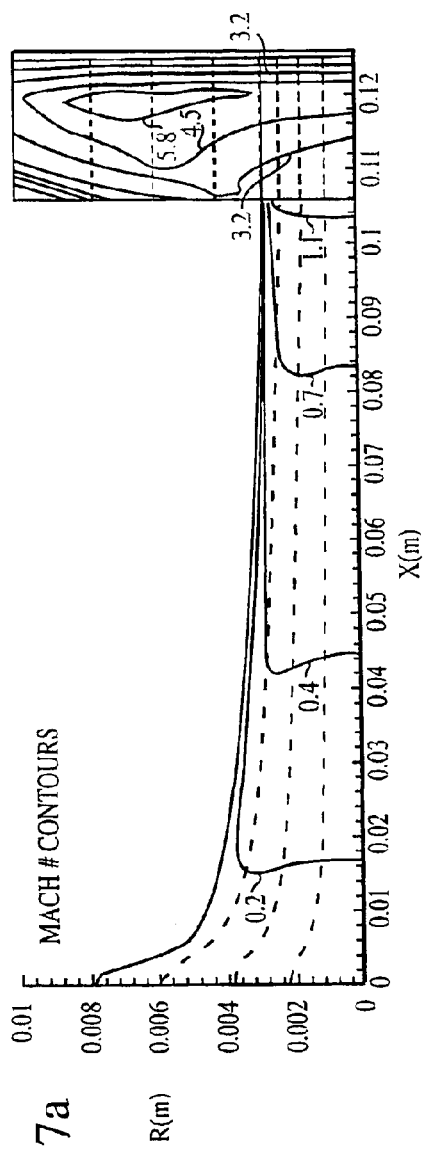
FIG. 7a is a diagram of predicted velocity vectors and Mach numbers in a hypersonic particle beam deposition system.
Figure 7B:
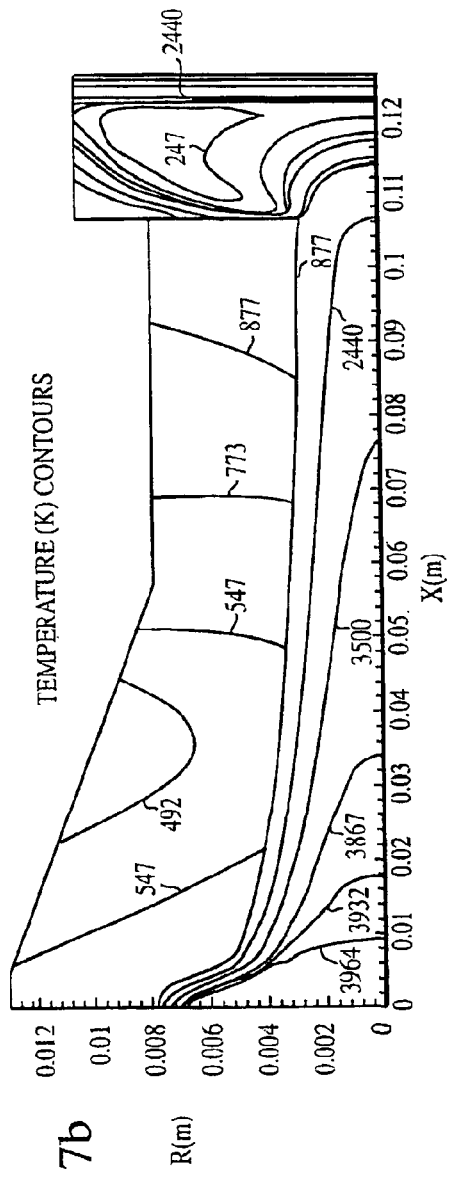
FIG. 7b is a diagram of predicted temperature contours in a hypersonic particle beam deposition system.

Computations for a two-dimensional asymmetric flow of pure argon were conducted. The computations simulate flow through the nozzle, including detailed heat transfer through the boron nitride nozzle walls, and the flow between the nozzle exit and the substrate. A uniform velocity inlet condition was assumed, and the gas temperature at the nozzle inlet was set to 4000K. Other boundary conditions included a pressure of 2.5 Torr at the exit of the flow field, and convective and radiative heat losses from the nozzle's outer boundary. The simulations were performed using the commercially available software CFD-ACE. A conjugate gradient solver was used to make calculations across flow boundaries. A two-dimensional plot of calculated velocity vectors and Mach numbers is shown in FIG. 7a, and predicted temperature contours are shown in FIG. 7b. Mach numbers up to 6.5 are predicted. A detached recompression shock is predicted to be located about 2.5 mm above the substrate.

While little materials characterization has been performed on the films deposited by focused deposition, the properties are expected to be very similar to those obtained in the hypersonic plasma particle deposition process. These properties are described in the following.

Figure 8:
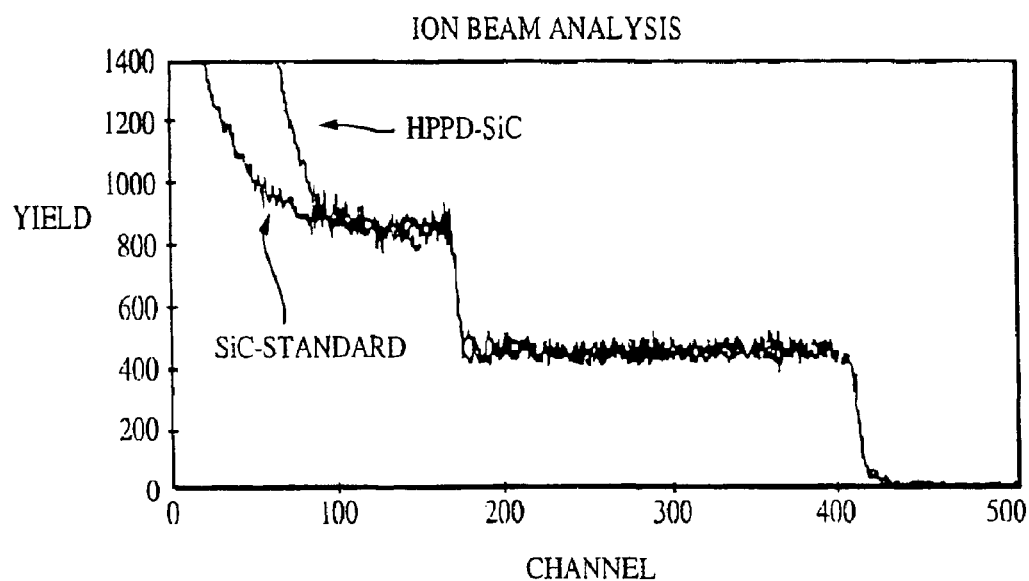
FIG. 8 is a graph comparing the RBS spectrum for a deposited film of SiC to a spectrum for standard SiC.

In an SEM image, the deposited films appear to have the same morphology as those deposited earlier using higher Si precursor flow rates, with the exception of the absence of macroparticles in the new results. Rutherford back scattering (RBS) analysis showed that high substrate temperature (740° C.) reduced the chlorine content of the film to below 1.5%. Film density was determined by RBS to be 80% of the theoretical SiC density for the 740° C. substrate temperature experiments. Density measurements indicated porosity increasing with decreasing substrate temperature. FIG. 8 shows a comparison of the RBS spectrum for a deposited film to a spectrum for standard SiC.

Mechanical properties of films deposited at substrate temperatures of 450° C. and 700° C. were evaluated with the nanoindentation method. Film thicknesses were approximately 5–6 μm. Indentation tests were carried out with two different nanoindenters, a Hysitron Triboscope and a micromechanical tester (MMT). The Hysitron Triboscope operating in conjunction with an atomic force microscope combines nanoindentation with the ability to image the indented area. With the MMT, higher loads (up to 900 mN) can be achieved compared to those available with the Hysitron (a few mN). The nanoindentation tests were performed with conical 90-degree indenters having radii of 400 nm and 1 μm for the Hysitron and MMT, respectively. Hardness evaluation relied on load-displacement curve analysis using the Oliver and Pharr method. Oliver, W. C., and Pharr, G. M., J. Mater. Res. 7:1564 (1992).

Figure 9:
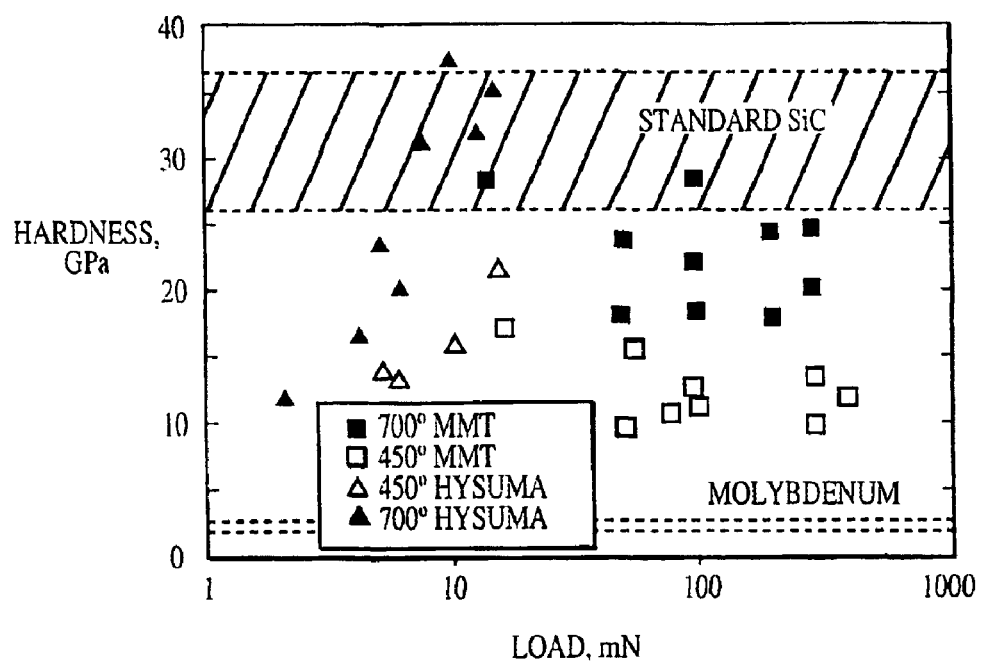
FIG. 9 is a graph that compares hardness for a deposited film of SiC to that of standard SiC.

FIG. 9 summarizes the hardness measurements. From this figure, it is evident that hardness values are higher for the high-temperature deposit. Even at the relatively high level of 20% porosity, these values correspond to the top of the hardness range reported for fully dense standard SiC. For both films, measurements at shallow penetration depths (Hysitron) indicate that hardness decreases with decreasing depth of penetration. This result is consistent with the high surface roughness and elevated porosity of near-surface layers (observed by SEM). Indentation with the MMT at greater penetration depths yields depth-independent values of hardness. These values are lower than those expected from the low-depth measurement trends.

Qualitative adhesion strength assessment was performed with a 1 kg applied load using a Vickers Indenter. Higher temperature deposits exhibited better adhesion, and only film cracking was apparent. In contrast, extensive spalling was observed for a lower temperature deposit. Quantitative measurements were not possible in either case, due to irregular spalling or film cracking. To obtain quantitative adhesion measurements, 1 μm tungsten overlayer was sputtered over the SiC films. Tungsten was expected to reduce the effects of indentation-induced cracking and to increase the force for delamination. Indentation tests to evaluate adhesion were carried out with the MMT. For a low temperature film, measurements obtained from delamination induced by a 900 mN load indicate an adhesion strength of 2.7–3.9 $J/m^2$. No delamination was observed for the high temperature film.

A number of embodiments of the invention have been described. Nevertheless, it will be understood that various modifications may be made without departing from the spirit and scope of the invention. Accordingly, other embodiments are within the scope of the following claims.

What is claimed is:

1. A particle deposition apparatus, comprising:
    a) a particle source that generates a plurality of particles in a suspended form;
    b) an expansion chamber in communication with the particle source and having an interior pressure that is substantially lower than the interior pressure of the particle source;
    c) a deposition chamber;
    d) a substrate support located inside the deposition chamber; and
    e) an aerodynamic focusing stage connecting the expansion chamber to the deposition chamber, and comprising a plurality of aerodynamic focusing elements.

2. The particle deposition apparatus of claim 1, wherein the particle source generates a plurality of nanoparticles.

3. The particle deposition apparatus of claim 1, wherein the particle source includes a dc torch.

4. The particle deposition apparatus of claim 1, wherein the particle source is a thermal plasma expansion reactor.

5. The particle deposition apparatus of claim 1, wherein the particle source is a laser pyrolisis reactor.

6. The particle deposition apparatus of claim 1, wherein the particle source is an evaporation-condensation reactor.

7. The particle deposition apparatus of claim 1, wherein the particle source is an electrospray particle source.

8. The particle deposition apparatus of claim 1, wherein the aerodynamic focusing stage comprises between two and five aerodynamic focusing elements.

9. The particle deposition apparatus of claim 1, further comprising a hollow nozzle between the particle source and the expansion chamber.

10. The particle deposition apparatus of claim 9, wherein the hollow nozzle generates a hypersonic flow of particles, and the aerodynamic focusing stage focuses the flow of particles into a collimated beam.

11. The particle deposition apparatus of claim 10, wherein the substrate support is positioned normal to the collimated beam.

12. The particle deposition apparatus of claim 1, wherein the substrate support is translatable.

13. A method for depositing particles on a substrate, comprising the steps of:

a) generating an aerosol cloud of particles;

b) accelerating the particles through a nozzle;

c) creating a collimated beam of particles by passing the particle through a plurality of aerodynamic focusing lenses;

d) impacting the collimated beam of particles against the substrate.

14. The method of claim 13, wherein the particles are comprised of nanoparticles.

15. The method of claim 13, wherein the aerosol cloud is generated in a plasma expansion reactor.

16. The method of claim 13, wherein the nanoparticles are accelerated through the nozzle to hypersonic speeds.

17. The method of claim 13, further including the step of translating the substrate in a predetermined manner to create a pattern of nanoparticles on the substrate.

18. The method of claim 17, wherein the substrate is translated in more than one direction.

* * * * *

UNITED STATES PATENT AND TRADEMARK OFFICE
CERTIFICATE OF CORRECTION

PATENT NO. : 6,924,004 B2
DATED : August 2, 2005
INVENTOR(S) : Nagaraja P. Rao et al.

It is certified that error appears in the above-identified patent and that said Letters Patent is hereby corrected as shown below:

<u>Column 1,</u>
Line 18, after the word "government" please insert, -- through National Science Foundation grant #CTS-9520147-002 --.

Signed and Sealed this

Twenty-second Day of November, 2005

JON W. DUDAS
*Director of the United States Patent and Trademark Office*